(12) United States Patent
Bito et al.

(10) Patent No.: US 8,293,371 B2
(45) Date of Patent: *Oct. 23, 2012

(54) POLYIMIDE RESIN, POLYIMIDE FILM, AND POLYIMIDE LAMINATE

(75) Inventors: Tsuyoshi Bito, Kanagawa (JP); Shuta Kihara, Kanagawa (JP); Jitsuo Oishi, Kanagawa (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 999 days.

This patent is subject to a terminal disclaimer.

(21) Appl. No.: 11/814,499

(22) PCT Filed: Jan. 20, 2006

(86) PCT No.: PCT/JP2006/300844
§ 371 (c)(1),
(2), (4) Date: Nov. 6, 2008

(87) PCT Pub. No.: WO2006/077964
PCT Pub. Date: Jul. 27, 2006

(65) Prior Publication Data
US 2009/0068482 A1    Mar. 12, 2009

(30) Foreign Application Priority Data

Jan. 21, 2005 (JP) .................. 2005-013720
Jan. 28, 2005 (JP) .................. 2005-020655
Feb. 4, 2005 (JP) .................. 2005-028466

(51) Int. Cl.
*B32B 15/08* (2006.01)
*B05D 1/00* (2006.01)
*C08G 73/10* (2006.01)

(52) U.S. Cl. ............ 428/458; 428/457; 428/473.5; 427/372.2; 427/384; 427/388.1; 427/388.2; 528/289

(58) Field of Classification Search .......... None
See application file for complete search history.

(56) References Cited

U.S. PATENT DOCUMENTS

| | | | |
|---|---|---|---|
| 6,214,923 B1 * | 4/2001 | Goto et al. .......... | 524/514 |
| 6,639,343 B2 | 10/2003 | Takahashi et al. | |
| 8,110,652 B2 * | 2/2012 | Bito et al. .......... | 528/353 |
| 2004/0081906 A1 | 4/2004 | Kenmoku et al. | |
| 2004/0266979 A1 | 12/2004 | Oguro et al. | |

FOREIGN PATENT DOCUMENTS

| | | |
|---|---|---|
| JP | 55-91895 | 7/1980 |
| JP | 63-259515 | 10/1988 |
| JP | 05-032950 | 2/1993 |
| JP | 05-059344 | 3/1993 |
| JP | 07-152037 | 6/1995 |
| JP | 2001-329246 | 11/2001 |
| JP | 2003-155342 | 5/2003 |
| JP | 2003-168800 | 6/2003 |
| JP | 2005-015629 | 1/2005 |

OTHER PUBLICATIONS

Taiwanese Official Action dated Jun. 25, 2012, for TW Application No. 095102153.

* cited by examiner

*Primary Examiner* — Monique Jackson
(74) *Attorney, Agent, or Firm* — Antonelli, Terry, Stout & Kraus, LLP.

(57) ABSTRACT

A polyimide resin composed of a repeating unit represented by the following formula (1):

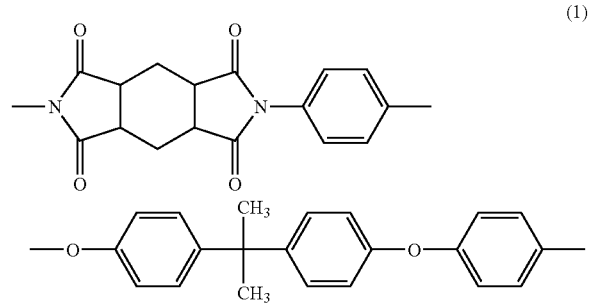

or composed of the repeating unit represented by the formula (1) and at least one repeating unit represented by the following formula (2):

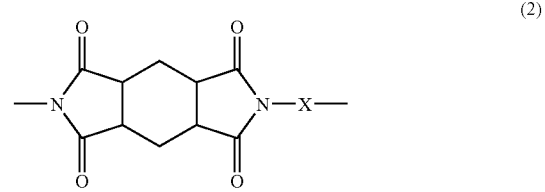

wherein X is the same as defined in the specification, exhibits a good thermoplastic property, a high solubility in solvents and a good heat resistance as well as a low water absorption and an excellent adhesion property. The polyimide resin is useful as the material for the adhesive layer of a metal-clad laminate which is composed of an insulating substrate, a metal layer and an adhesive layer disposed between the insulating substrate and the metal layer.

32 Claims, No Drawings

POLYIMIDE RESIN, POLYIMIDE FILM, AND POLYIMIDE LAMINATE

TECHNICAL FIELD

The present invention relates to polyimide resins having a good heat resistance, a high solubility in solvent, a good thermoplastic property as well as a low water absorption, films made of the polyimide resins, and metal-clad laminates using an adhesive prepared from the polyimide resins. The metal-clad laminates are applicable to printed wiring boards, surface heating elements, electromagnetic shielding materials, flat cables, etc.

BACKGROUND ART

Some metal-clad laminates are produced by bonding an insulating substrate and a metal layer to each other through an adhesive or an adhesive film. For example, there has been proposed a meta-clad laminate having a three-layer structure which is formed by bonding an insulating substrate constituted from an aromatic polyimide resin film and a metal layer to each other through an adhesive film (refer to Patent Document 1).

Hitherto, the adhesives or adhesive films made of epoxy resins or acrylic resins have been mainly used. However, since these resins are poor in heat resistance, products obtained after adhesion tend to show an insufficient heat resistance, to limit the conditions for subsequent processing and use.

Under these circumstances, there is a demand for adhesives and adhesive films having an excellent heat resistance. For example, there are disclosed a method of forming a heat-pressure-sensitive adhesive layer by applying a solution of a polyimide resin or a polyamic acid onto an insulating substrate, removing the solvent and then optionally conducting an imidation treatment; a method of forming a heat-pressure-sensitive film by applying a solution of a polyimide resin or a polyamic acid on a substrate such as a glass plate, removing the solvent and then optionally conducting an imidation treatment; and a method of heat-press bonding the adhesive layer or adhesive film to an adherend such as a metal layer (refer to Patent Documents 2 and 3). The methods for forming the adhesive layer or film are roughly classified into methods using a solution of a polyimide resin and methods using a solution of a polyamic acid.

In the methods using the polyamic acid solution, to convert the polyamic acid solution which is applied on an insulating substrate into an adhesive layer or adhesive film, an imidation step at a high temperature exceeding 300° C. must be conducted. If the imidation step is omitted, the resultant metal-clad laminates have an extremely low heat resistance. In the methods using the polyimide resin solution, an adhesive layer or adhesive film is produced only by evaporating the solvent at a temperature as low as up to about 200° C. Therefore, the methods using the polyimide resin solution are more advantageous in the production of high-heat resistant metal-clad laminates. Many of the conventional adhesive layers made of wholly aromatic polyimide resins have been produced using the polyamic acid solution. To prepare a solution, the polyimide resin must be solvent-soluble.

In the conventional metal-clad laminates, when the amount of residual volatile components in the adhesive layer interposed between the insulating substrate and the metal layer is large, the adhesive layer tends to suffer from whitening, swelling, foaming, etc. during a soldering step where the temperature reaches 250° C. or higher, to considerably impair the adhesion between the insulating substrate and the metal layer (refer to Patent Document 4). The residual volatile components in the adhesive layer include water and solvent which are not removed in the imidation step for forming the adhesive layer or adhesive film and the solvent removal step, water absorbed from surrounding atmosphere during the production, and water absorbed when immersed in an aqueous solution during an etching step. Among these volatile components, water is especially problematic. To solve the problem, it is required to lower the water absorption of polyimide which governs the water content.

There is also disclosed a thermoplastic polyimide resin containing a 1,2,4,5-cyclohexanetetracarboxylic acid skeleton in its main molecular chain which is produced from 1,2,4,5-cyclohexanetetracarboxylic dianhydride or its reactive derivative (refer to Patent Document 6). In Example 1 of Patent Document 6, there is disclosed a transparent yellow polyimide resin film having a glass transition temperature of 304° C., which is produced by reacting 1,2,4,5-cyclohexanetetracarboxylic dianhydride or its reactive derivative with diaminodiphenylmethane to obtain an amic acid, imidating the amic acid under heating after coating, and then heat-pressing the imidated product into film. In addition, in Patent Document 5, it is described that a less-colored, transparent polyimide resin film having a glass transition temperature of 300° C. or higher is obtained from a polyimide resin solution in diaminodiphenyl ether.

The polyimide resin having a 1,2,4,5-cyclohexanetetracarboxylic acid skeleton is advantageous in view of forming and processing, because its molecular weight is relatively easily increased, it is easily formed into a flexible film, and its solubility in solvents is sufficiently high. Further, such a polyimide resin is extremely advantageous because a flexible adhesive layer having a sufficient thickness and a good durability is easily obtained by a coating method.

However, the polyimide resin film described in Patent Document 6 is discolored because the film is formed through a high-temperature imidation step as in the conventional methods. In addition, the polyimide resin films described in Patent Documents 5 and 6 have a high water absorption, and therefore, show a poor dimensional stability upon moisture absorption.

Patent Document 1: JP 55-91895A
Patent Document 2: JP 5-32950A
Patent Document 3: JP 5-59344A
Patent Document 4: JP 2001-329246A
Patent Document 5: JP 2003-168800A
Patent Document 6: U.S. Pat. No. 3,639,343

DISCLOSURE OF THE INVENTION

An object of the present invention is to solve the problems on wholly aromatic polyimide resins which have been used for forming adhesive layers, and provide a polyimide resin having a good thermoplastic property, a high solubility in solvents and a good heat resistance as well as a low water absorption and an excellent adhesion property; a process for producing the polyimide resin; a film containing the polyimide resin; and a metal-clad laminate including an adhesive layer made of the polyimide resin.

As a result of extensive studies in view of the above object, the inventors have found that polyimide resins containing a specific repeating unit exhibit a good thermoplastic property, a good adhesion, a high solubility in solvents and a good heat resistance as well as a low water absorption. In addition, it has been found that the adhesion of polyimide resins to a metal layer and an insulating substrate is improved by combinedly using different kinds of compounds as the diamine component, each having a specific structure or a specific functional group, or by regulating the viscosity of polyimide resins within a specific range. The present invention has been accomplished on the basis of the above findings.

Thus, the present invention provides a polyimide resin composed of a repeating unit represented by the following formula (1):

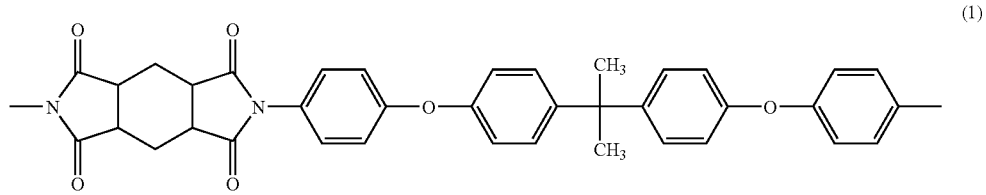

or composed of the repeating unit of the formula (1) and at least one repeating unit represented by the following formula (2):

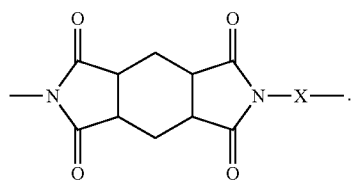

wherein X is a divalent aliphatic group having 2 to 39 carbon atoms, a divalent alicyclic group having 3 to 39 carbon atoms, a divalent aromatic group having 6 to 39 carbon atoms or a combination of these divalent groups; a main chain of X optionally has at least one intervening bonding group selected from the group consisting of —O—, —SO$_2$—, —CH$_2$—, —C(CH$_3$)$_2$—, —OSi(CH$_3$)$_2$—, —C$_2$H$_4$O— and —S—; and X optionally has at least one functional group selected from the group consisting of carboxyl group, hydroxyl group and carbonyl group in a concentration F of more than zero but not more than 1 meq/g polyimide resin, a content of the repeating unit of the formula (1) being 50 mol % or more of a total of the repeating units, and a logarithmic viscosity 1 of the polyimide resin being from 0.3 to 2 dL/g when measured at 30° C. by using a 0.5 g/dL solution of the polyimide resin in N-methyl-2-pyrrolidone.

The present invention also provides a process for producing the polyimide resin.

The present invention further provides a process for producing a polyimide resin film, including a step of casting a solution of the polyimide resin on a substrate and a step of removing an organic solvent by evaporation.

The present invention further provides a metal-clad laminate composed of an insulating substrate, a metal layer and an adhesive layer disposed between the insulating substrate and the metal layer, wherein the adhesive layer is formed from the polyimide resin.

PREFERRED EMBODIMENTS FOR CARRYING OUT THE INVENTION

The present invention is described in detail below.

The polyimide resin of the present invention (Polyimide A) is composed of the repeating unit represented by the following formula (1):

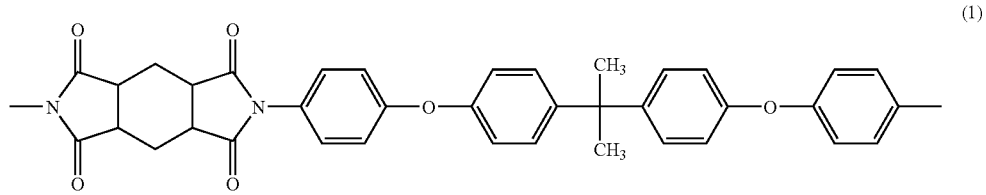

or composed of the repeating unit of the formula (1) and at least one repeating unit represented by the following formula (2):

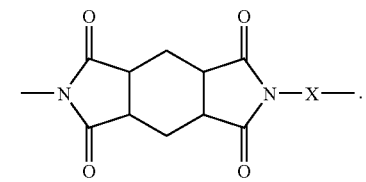

The content of the repeating unit of the formula (1) is 50 mol % or more, preferably 70 mol % or more and more preferably 80 mol % or more (each inclusive of 100 mol %) on the basis of the total of the repeating units. Polyimide A is either a block copolymer or a random copolymer.

In the formula (2), X differs from the group represented by the following formula (3):

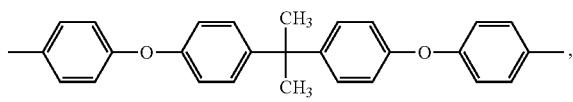
(3)

and is a divalent aliphatic group having 2 to 39 carbon atoms, a divalent alicyclic group having 3 to 39 carbon atoms, a divalent aromatic group having 6 to 39 carbon atoms or a combination of these divalent groups. The main chain of X optionally includes at least one intervening bonding group selected from the group consisting of —O—, —SO$_2$—, —CH$_2$—, —C(CH$_3$)$_2$—, —OSi(CH$_3$)$_2$—, —C$_2$H$_4$O— and —S—. X optionally has at least one functional group selected from the group consisting of carboxyl group, hydroxyl group and carbonyl group (intervening the main chain of X). Examples of X include divalent aliphatic groups such as polyalkylene, polyoxyalkylene and xylylene, each being optionally substituted by alkyl, halogen, carboxyl or hydroxyl; divalent alicyclic groups derived from cyclohexane, dicyclohexylmethane, dimethylcyclohexane, isophorone, and norbornane, each being optionally substituted by alkyl, halogen, carboxyl or hydroxyl; and divalent aromatic groups derived from benzene, naphthalene, biphenyl, diphenylmethane, diphenyl ether, diphenyl sulfone, and benzophenone, each being optionally substituted by alkyl, halogen, carboxyl or hydroxyl. To improve the adhesion strength while maintaining the various properties of the adhesive layer well balanced, X is preferably m-phenylene group or m-xylylene group.

When X has the functional group, the concentration F of the functional group (milliequivalent per 1 g of polyimide resin) is more than zero but not more than 1 meq/g polyimide resin and preferably more than zero but not more than 0.6 meq/g polyimide resin. The concentration F is readily determined from the charged amounts of raw materials for the synthesis. As the concentration F increases beyond 1, the adhesion property is enhanced, but the water absorption undesirably increases. Therefore, the concentration F is preferably as low as possible within the above range as long as the polyimide resin shows an intended adhesion property.

Since Polyimide A is used in the form of a solution, the molecular weight thereof is preferably expressed by a viscosity, in particular, a logarithmic viscosity. The logarithmic viscosity η of Polyamide A is from 0.3 to 2 dL/g when measured at 30° C. on a 0.5 g/dL solution in N-methyl-2-pyrrolidone. If less than 0.3 dL/g, the strength of the polyimide resin itself is low, thereby failing to obtain a metal-clad laminate having a sufficient peel strength. If more than 2 dL/g, the solution (varnish) of the polyimide resin is highly viscous to make the coating operation difficult. Therefore, the solution must be diluted to a considerable extent, resulting in poor handling property. To enhance the adhesion strength while maintaining various properties of the adhesive layer well balanced, the logarithmic viscosity η is preferably from 0.3 to 1 dL/g.

The molecular terminal of Polyimide A is usually an amino group, a carboxyl group or a carboxylic anhydride group. By reacting the terminal groups of Polyimide A with a compound having a carboxylic anhydride group or an amino group, the number of terminal functional groups is minimized, or the functional group such as amino group and carboxyl group or other groups can be introduced to the terminal end of Polyimide A. To reduce the water absorption, a group having a low polarity (non-functional group) may be introduced into the terminal end of Polyimide A. The water absorption of Polyimide A when measured by the method described below is preferably 2.5% or less. The minimum water absorption which can be achieved industrially is usually about 1%.

Polyimide A is produced by reacting at least one tetracarboxylic acid component (Y) selected from the group consisting of 1,2,4,5-cyclohexanetetracarboxylic acid, 1,2,4,5-cyclohexanetetracarboxylic dianhydride (HPMDA) and reactive derivatives thereof such as 1,2,4,5-cyclohexanetetracarboxylic esters with at least one diamine component (Z) selected from the group consisting of diamines and reactive derivatives thereof. The preferred tetracarboxylic acid component (Y) is HPMDA. The tetracarboxylic acid component (Y) and the diamine component (Z) respectively include isomers.

Examples of the diamine component (Z) include diamines, diisocyanates and diaminodisilanes, with diamines being preferred. The diamine component for forming the repeating unit of the formula (1) (diamine component (Z1)) may include 2,2-bis[4-(4-aminophenoxy)phenyl]propane (BAPP) and reactive derivatives thereof, and the diamine component for forming the repeating unit of the formula (2) (diamine component (Z2)) may include NH$_2$—X—NH$_2$ wherein X is same as defined above and reactive derivatives thereof.

The diamine component (Z2) may be any of aromatic diamine, aliphatic diamine, alicyclic diamine, reactive derivatives of these diamines, and a mixture thereof. The "aromatic diamine" referred to herein means diamines having an amino group directly bonded to an aromatic ring, which may contain aliphatic group, alicyclic group, aromatic group or other groups as a part of its structure. The "aliphatic diamine" referred to herein means diamines having an amino group directly bonded to an aliphatic group, which may contain aliphatic group, alicyclic group, aromatic group or other groups as a part of its structure. The "alicyclic diamine" referred to herein means diamines having an amino group directly bonded to an alicyclic group, which may contain aliphatic group, alicyclic group, aromatic group or other groups as a part of its structure. For example, 1,3-phenylenediamine (m-phenylenediamine: MPD) is an aromatic diamine because the amino group is directly bonded to the aromatic ring (benzene ring), and m-xylylenediamine (MXDA) is an aliphatic diamine because the amino group is directly bonded to the aliphatic group (methylene group).

In general, when a tetracarboxylic dianhydride is reacted with an aliphatic diamine or alicyclic diamine, an intermediate polyamic acid is reacted with an amino group of the aliphatic diamine or alicyclic diamine to form a strongly bonded salt. Therefore, a polyimide having a high molecular weight is difficult to be produced. To remove this disadvantage, an expedient such as the use of a solvent, such as cresol, having a high dissolving power to the salt should be adopted. However, when using 1,2,4,5-cyclohexanetetracarboxylic dianhydride as the tetracarboxylic dianhydride, a relatively weakly bonded salt is formed by the reaction of the polyamic acid with an amino group of the aliphatic diamine or alicyclic diamine. Therefore, the imidation relatively easily proceeds, to easily increase the molecular weight.

Examples of the aliphatic diamine include ethylenediamine, hexamethylenediamine, polyethylene glycol bis(3-amonopropyl)ether, polypropylene glycol bis(3-aminopropyl)ether, 1,3-bis(aminomethyl)cyclohexane, 1,4-bis(aminomethyl)cyclohexane, p-xylylenediamine, m-xylylenediamine and siloxanediamine.

Examples of the alicyclic diamine include 4,4'-diaminodicyclohexylmethane, isophorone diamine and norbornane diamine.

Examples of the aromatic diamine include 1,4-phenylenediamine, 1,3-phenylenediamine, 2,4-toluenediamine, 4,4'-diaminodiphenyl ether, 3,4'-diaminodiphenyl ether, 4,4'-diaminodiphenylmethane, 1,4-bis(4-aminophenoxy)benzene, 1,3-bis(4-aminophenoxy)benzene, 1,3-bis(3-aminophenoxy)benzene, α,α'-bis(4-aminophenyl)-1,4-diisopropylbenzene, α,α'-bis(3-aminophenyl)-1,4-diisopropylbenzene, 4,4'-bis(4-aminophenoxy)biphenyl, 4,4'-diaminodiphenyl sulfone, bis[4-(4-aminophenoxy)phenyl]sulfone, bis[4-(3-aminophenoxy)phenyl]sulfone, 2,6-diaminonaphthalene and 1,5-diaminonaphthalene.

Examples of the diamine containing the functional group include 3,3'-dicarboxy-4,4'-diaminodiphenylmethane, 3,5-diaminobenzoic acid, 3,3'-dihydroxy-4,4'-diaminobiphenyl, 2,4-diaminophenol, 4,4'-diaminobenzophenone and 3,3'-diaminobenzophenone, with 3,3'-dicarboxy-4,4'-diaminodiphenylmethane (MBAA, 3,5-diaminobenzoic acid (DBA), 3,3'-dihydroxy-4,4'-diaminobiphenyl (HAB) and 4,4'-diaminobenzophenone (4,4'-DBP) being particularly preferred.

The adhesion strength of polyimide resin is enhanced by using the diamine containing the functional group, MPD or MXDA as the diamine component (Z2) or by controlling the logarithmic viscosity η within a range of from 0.3 to 2 dL/g when measured at 30° C. using a 0.5 g/dL solution of the polyimide resin in N-methyl-2-pyrrolidone.

Polyimide A is produced by the reaction of the diamine component (Z) (diamine component (Z1) or diamine components (Z1) and (Z2)) and the tetracarboxylic acid component (Y) in an amount of preferably from 0.66 to 1.5 mol, more preferably from 0.9 to 1.1 mol and still more preferably from 0.97 to 1.03 mol of the tetracarboxylic acid component (Y) per 1 mol of the diamine component (Z). When the diamine containing the functional group is used as the diamine component (Z2), the amount of the diamine to be used is controlled so as to regulate the concentration F of the functional group within 1 meq/g polyimide resin or less.

Polyimide A having a logarithmic viscosity η within the above range may be produced, for example, by controlling at least one of the amounts of raw materials, the reaction temperature and time, the amount of an end-terminating agent, the amount of a catalyst, etc. These conditions may be readily controlled by those skilled in the art by a preliminary reaction. For example, the logarithmic viscosity η increases within the above range as the molar ratio of the tetracarboxylic acid component (Y) and the diamine component (Z) reaches 1 or the reaction time becomes longer. In contrast, the logarithmic viscosity η decreases within the above range as the molar ratio is apart from 1 within the range of 0.66 to 1.5 or the reaction time becomes shorter. In the solution polymerization method, Polyimide A having a desired logarithmic viscosity η is obtained by selecting the end point of the reaction according to the predetermined relationship between the logarithmic viscosity η and the viscosity of reaction solution, the reaction conditions such as reaction time, etc. The reaction time is preferably from 2 to 12 h and the reaction temperature is preferably from 180 to 205° C.

The polyimide A is usually produced in the form of a solution in an organic solvent. Examples of the organic solvent include, but not limited to, N-methyl-2-pyrrolidone, N,N-dimethylacetamide, N,N-diethylacetamide, N,N-dimethylformamide, N,N-diethylformamide, N-methylcaprolactam, hexamethylphosphoramide, tetramethylenesulfone, dimethylsulfoxide, m-cresol, phenol, p-chlorophenol, 2-chloro-4-hydroxytoluene, diglyme, triglyme, tetraglyme, dioxane, γ-butyrolactone, dioxolane, cyclohexanone and cyclopentanone. These organic solvents may be used in combination of two or more. In view of a good performance of the polyimide varnish composed of Polyimide A and the solvent, N-methyl-2-pyrrolidone (NMP), N,N-dimethylacetamide (DMAC) and γ-butyrolactone (GBL) are preferably used alone or in combination of two or more. The amount of the organic solvent to be used is controlled such that the concentration of Polyimide A in the resultant organic solvent solution is preferably from 1 to 50% by weight, more preferably from 5 to 40% by weight. In the solution polymerization method, in addition to the above organic solvent, a poor solvent such as hexane, heptane, benzene, toluene, xylene, chlorobenzene and o-dichlorobenzene may be used in an amount not causing the precipitation of the polymer being produced.

Polyimide A may be produced by (1) a solution polymerization method; (2) an imidation method in which a polyamic acid solution is formed into a film and then the polyamic acid is imidated; (3) a solid-phase polymerization method in which imide salts such as a half ester salt of HPMDA or imide oligomers are solid-phase polymerized; (4) a method of reacting a tetracarboxylic dianhydride with a diisocyanate; and other known methods. These methods may be used in combination. The reaction of the tetracarboxylic acid component (Y) and the diamine component (Z) may be conducted in the presence of a known catalyst such as acids, tertiary amines and anhydrides.

Among these methods, the following solution polymerization methods (1) to (3) are more preferred because the organic solvent solution of Polyimide A is directly obtained:

(1) a method of stirring a mixture of the diamine component (Z), the organic solvent and an optional catalyst at a rotating speed of 10 to 600 rpm to prepare a uniform solution, and then adding the tetracarboxylic acid component (Y) and optionally a catalyst while maintaining the solution at 30 to 90° C.;

(2) a method of stirring a mixture of the tetracarboxylic acid component (Y), the organic solvent and an optional catalyst at a rotating speed of 10 to 600 rpm to prepare a uniform solution, and then adding the diamine component (Z) and optionally a catalyst while maintaining the solution at 30 to 90° C.; and (3) a method in which the reaction solution obtained after the method (1) or (2) is heated to 160 to 230° C., preferably 180 to 205° C. according to the boiling point of the organic solvent over 0.1 to 6 h, then the temperature is held nearly constant for 0.5 to 24 h, preferably 2 to 12 h while collecting the components removed from the system, and the reaction solution is added with an organic solvent, if necessary, and cooled to a desired temperature.

The solution polymerization for producing Polyimide A may be conducted in the presence of at least one catalyst selected from the group consisting of tertiary amines such as trimethylamine, triethylamine (TEA), tripropylamine, tributylamine, triethanolamine, N,N-dimethylethanolamine, N,N-diethylethanolamine, triethylenediamine, N-methylpyrrolidine, N-ethylpyrrolidine, N-methylpiperidine, N-ethylpiperidine, imidazole, pyridine, quinoline and isoquinoline. The amount of the catalyst, if used, is preferably from 0.1 to 100 mol % and more preferably from 1 to 10 mol % of the tetracarboxylic acid component (Y).

The organic solvent solution of Polyimide A may also contain a surfactant such as fluorine-based surfactants and polysiloxane-based surfactants. The surfactant facilitates the production of an adhesive layer and a polyimide resin film having a good surface smoothness.

The polyimide resin film is produced by applying (casting) the organic solvent solution of Polyimide A on a flat, smooth substrate having a good releasability such as a glass plate and a metal plate and then heating the applied solution to 50 to 350° C. to remove the organic solvent by evaporation. Preferably, after removing the solvent by evaporation at 120° C. or lower to form a self-supporting film, the film is separated from the substrate, fixed at its ends, and then dried at a temperature of from the boiling point of the organic solvent to 350° C., thereby producing the polyimide resin film. The pressure of the drying atmosphere may be reduced pressure, normal pressure or increased pressure. The thickness of the polyimide resin film is preferably from 1 to 100 μm and more preferably from 2 to 50 μm. Alternatively, the polyimide resin film is produced by applying a polyamic acid solution in place of the organic solvent solution of Polyimide A on a flat, smooth substrate and then heating the applied solution to 50 to 350° C. to conduct the dehydrating imidation reaction.

The metal-clad laminate of the present invention includes an insulating substrate, a metal layer, and an adhesive layer made of Polyimide A which is disposed between the insulating substrate and the metal layer.

The metal-clad laminate is produced by the method of applying an organic solvent solution of Polyimide A onto one or both of the insulating substrate and the metal layer, removing the organic solvent by evaporation at 50 to 350° C. to form an adhesive layer, superposing the insulating substrate and the metal layer through the adhesive layer, and then heat-pressing the superposed product, or by the method of disposing the polyimide resin film between the insulating substrate and the metal layer and then heat-pressing the obtained product. Alternatively, the metal-clad laminate including the insulating substrate and the metal layer which are strongly bonded to each other is also produced by the method of directly forming a metal thin film on one surface of the polyimide resin film by a method such as sputtering, vapor deposition and electroless plating, superposing the insulating substrate on the other surface of the polyimide resin film, and then heat-pressing the superposed product, or by the method of forming an adhesive layer on a surface of the insulating substrate and then forming a metal thin film on the surface of the adhesive layer by a method such as sputtering, vapor deposition and electroless plating.

The thickness of the adhesive layer is preferably from 1 to 100 g/m and more preferably from 2 to 50 μm. The glass transition temperature of Polyimide A varies depending upon the diamine used, and is preferably from 200 to 350° C. and more preferably from 230 to 300° C. Since Polyimide A exhibits the adhesion property at temperatures not lower than the glass transition temperature, an excessively high heat-pressing temperature is required if the glass transition temperature is too high, and the heat resistance of the film itself is insufficient if the glass transition temperature is too low.

The metal layer may be formed from a metal foil which is produced by electroplating, press-rolling, etc., or may be directly formed, as mentioned above, on the surface of the polyimide resin film or on the surface of the adhesive layer which is formed on the insulating substrate. The thickness of the metal layer is not particularly limited, and preferably from 1 to 100 μm. The material for the metal layer is preferably copper. In addition, one surface (adherent surface) or both surfaces of the metal foil may be surface-treated to adjust the surface roughness Rz to 0.1 to 12 μm. A so-called low profile copper foil has a surface roughness Rz of preferably from 0.1 to 2 μm, more preferably from 0.4 to 2 μm and still more preferably from 1.0 to 2 μm. The surface of a metal foil which is not surface-treated for improving the adhesion property is generally treated with a rust preventive, etc. Therefore, it is recommended to wipe the surface with a cloth impregnated with an organic solvent such as acetone before use.

The insulating substrate used in the present invention is not particularly limited as long as the substrate is capable of electrically insulating the metal layer. The insulating substrate may be flexible or rigid. The thickness of the insulating substrate varies with the flexible substrate and the rigid substrate, and is preferably from 3 to 2000 μm. Examples of the material for the flexible insulating substrate include polyimide resins (exclusive of Polyimide A), polybenzimidazole, polybenzoxazole, polyamides (inclusive of aramid), polyether imides, polyamide imides, polyesters (inclusive of liquid crystal polyesters), polysulfones, polyether sulfones, polyether ketones and polyether ether ketones. Preferred are polyimide resin films which are available under tradenames of "Kapton EN", "Kapton V" and "Kapton H" (Du Pont-Toray Co., Ltd.), and "Apical NPI" and "Apical AH" (Kaneka Corporation). The thickness is not particularly limited, and preferably from 3 to 150 μm and more preferably from 7.5 to 75 μm.

Examples of the rigid insulating substrate include insulating plates such as a glass plate, a ceramic plate and a plastic plate; metal plates having an insulating film; and shaped products produced by impregnating or kneading various thermoplastic or thermosetting resins such as liquid crystal polymers, phenol resins and epoxy resins into or with a glass fiber fabric, a plastic fiber fabric or a reinforcing material such as short glass fiber. The thickness is not particularly limited, and preferably from 30 to 2000 μm.

The heat press is generally effected by a method using a multi-stage (vacuum) press machine or a continuous press method using a pressure roll.

The heat-press temperature is selected from a range of preferably from 200 to 400° C. and more preferably from 250 to 350° C. while taking the glass transition temperature of Polyimide A into consideration, as mentioned above. The pressure for the heat press is preferably from 0.01 to 20 MPa and more preferably from 0.1 to 10 MPa. Further, the heat press is preferably conducted under reduced pressure in order to remove the solvent and bubbles.

In the metal-clad laminate of the present invention, the peel strength of the metal layer which is measured by a method mentioned below is 0.5 N/mm or more in view of practical use and preferably 0.8 N/mm or more.

EXAMPLES

The present invention will be described in more detail below with reference to the following examples. However, these examples are only illustrative and not intended to limit the invention thereto.

Various properties were measured by the following methods.

(1) IR Spectrum

Measured using "JIR-WINSPECS50" available from JEOL, Ltd.

(2) Logarithmic Viscosity η

A 0.5 g/dL solution of polyimide in N-methyl-2-pyrrolidone was prepared. The falling time of the solution between the marks was measured using a Canon Fenske viscometer in a thermostatic water bath maintained at 30° C. The logarithmic viscosity η was calculated from the following formula:

$$\eta = \ln(\text{falling time of solution/falling time of N-methyl-2-pyrrolidone})/0.5.$$

The logarithmic viscosity value is analogous to an intrinsic viscosity and therefore readily determined.

(3) Glass Transition Temperature

Determined by DSC method. Using "DSC-50" available from Shimadzu Corporation, the mid point glass transition temperature Tmg was measured in a range of 40 to 350° C. at a temperature rise rate of 10° C./min, and Tmg was taken as the glass transition temperature.

(4) Water Absorption of Polyimide

Determined by the method of IPC-TM-650, 2.6.2.1. The polyimide film having a size of 50.8×50.8 mm was dried at 120° C. for 1 h to measure the weight ($W_0$). Thereafter, the polyimide film was immersed in distilled water at 23° C. for 24 h. Immediately after wiping off the water from the surface, the weight ($W_1$) of the film was measured. The water absorption was calculated according to the following formula:

$$\text{Water Absorption}(\%)=(W_1-W_0)\div W_0\times 100.$$

(5) Peel Strength of Metal Layer

Measured according to JIS C6471 "Method for measuring 90° peel strength of copper foil (Method A using a rotary drum-type support jig for measuring a peel strength).

(6) Soldering Heat Resistance

The following test was conducted by referring to JIS C6471.

The metal-clad laminate was cut into a test piece having a size of 10×50 mm, and the test piece was allowed to stand in a thermostatic chamber maintained at a humidity of 50% and 23° C. for 24 h. Next, the test piece was floated in soldering baths at 260° C. and 280° C. for 20 s. The result with no abnormal appearance such as swelling and peeling was rated as A and the result with abnormal appearance was rated as C.

Example 1

In a 300-mL five-necked round bottom glass flask equipped with half-moon stainless stirring blades, a nitrogen inlet, a Dean-Stark fitted with a cooling tube, a thermometer and a glass end cap, 26.00 g (0.06334 mol) of 2,2-bis[4-(4-aminophenoxy)phenyl]propane (BAPP, available from Wakayama Seika Kogyo Co., Ltd.), 0.76 g (0.00704 mol) of m-phenylenediamine (MPD, available from Kanto Chemical Co., Inc.), 51.04 g of γ-butyrolactone (GBL, available from Mitsubishi Chemical Corp.) as a solvent and 0.356 g of triethylamine (TEA, available from Kanto Chemical Co., Inc.) as a catalyst were stirred at 100 rpm under a nitrogen atmosphere to obtain a solution. After adding 15.77 g (0.07037 mol) of 1,2,4,5-cyclohexanetetracarboxylic dianhydride (HPMDA, available from Mitsubishi Gas Chemical Company, Inc.) and 12.76 g of dimethylacetamide (DMAC, available from Mitsubishi Gas Chemical Company, Inc.) respectively at one time, the solution was heated on a mantle heater to raise the temperature of the reaction system to 180° C. over about 20 min. The temperature of the reaction system was maintained at 180° C. for 5 h while collecting the distillates.

The reaction solution was mixed with 96.20 g of DMAC and stirred at about 130° C. for about 30 min to obtain a uniform solution, which was then air-cooled to 100° C. over about 10 min, to obtain a Polyimide A solution having a solid content of 20% by weight.

Using a coater, the Polyimide A solution was applied onto a flat and smooth glass plate sprayed with a very small amount of a release agent. The applied solution was heated on a hot plate at 100° C. for 1 h to form a self-supporting film. The film separated from the glass plate was fixed to a stainless frame by clips at several portions and then allowed to stand in a vacuum dryer at 200° C. for 5 h to nearly completely remove the solvent (less than 1% by weight), thereby obtaining a Polyimide A film. IR spectrum of Polyimide A film showed characteristic absorptions attributable to imide ring at ν (C=O) 1776 and 1704 (cm$^{-1}$). Polyimide A had a logarithmic viscosity η of 1.05 dL/g, a glass transition temperature of 268° C. and a water absorption of 2.1%.

The Polyimide A solution prepared above was applied onto a 25 μm-thick polyimide resin film (tradename "Kapton 100EN," available from Du Pont-Toray Co., Ltd.). The resultant film was heated on a hot plate at 100° C. for 0.5 h and then dried in a vacuum dryer at 200° C. for 5 h, to form a 4 μm-thick adhesive layer on the insulating substrate. One surface of a 18 μm-thick electrolytic copper foil (product name "3EC-III," available from Mitsui Mining & Smelting Co. Ltd.) was roughened to form a roughened surface having a roughness Rz of 5.0 μm. The electrolytic copper foil was superposed on the adhesive layer via the roughened surface. The superposed film was sandwiched between mirror-finished stainless steel plates. The sandwiched structure was interposed between the hot plates of 330° C. in a hot press machine and held there for 3 min under a contact pressure of 0 MPa. Then, the heat press was conducted for 2 min at 330° C. under a pressure of 5 MPa. The heat-pressed product was interposed between the hot plates in a cold press machine and cooled for 2 min under a pressure of 5 MPa, to obtain a metal-clad laminate.

The peel strength of the metal layer was 1.09 N/mm and the soldering heat resistance was rated as A.

Example 2

In the same type of five-necked round bottom glass flask as used in Example 1, 27.280 g (0.06645 mol) of BAPP, 0.0914 g (0.00067 mol) of m-xylylenediamine (MXDA, available from Mitsubishi Gas Chemical Company, Inc.), 50.00 g of NMP and 0.34 g of TEA were stirred at 100 rpm under a nitrogen atmosphere to obtain a solution.

After adding 15.048 g (0.06713 mol) of HPMDA and 13.63 g of N-methyl-2-pyrrolidone (NMP, available form Mitsubishi Gas Chemical Company, Inc.) respectively at one time, the solution was heated on a mantle heater to raise the temperature of the reaction system to 195° C. over about 20 min. The temperature of the reaction system was maintained at 195° C. for 12 h while collecting the distillates.

The reaction solution was mixed with 96.37 g of DMAC and stirred at about 130° C. for about 30 min to obtain a uniform solution, which was then air-cooled to 100° C. over about 10 min, to obtain a Polyimide A solution having a solid content of 20% by weight.

Then, a Polyimide A film was produced in the same manner as in Example 1 except for using the Polyimide A solution prepared above. IR spectrum of Polyimide A film showed characteristic absorptions attributable to imide ring at ν (C=O) 1772 and 1706 (cm$^{-1}$). Polyimide A had a logarithmic viscosity η of 1.01 dL/g, a glass transition temperature of 262° C. and a water absorption of 1.9%.

Next, a metal-clad laminate was produced in the same manner as in Example 1 except for using the Polyimide A solution prepared above. The peel strength of the metal layer was 0.87 N/mm and the soldering heat resistance was rated as A.

Example 3

A metal-clad laminate was produced in the same manner as in Example 1 except for using the Polyimide A solution obtained in Example 2, a 25 μm-thick polyimide resin film (tradename "Apical NPI" available from Kaneka Corporation) as an insulating substrate, and a 18 μm-thick electrolytic copper foil (product name "JTC" available from Nikko Materials Co., Ltd.) having a roughened surface with a roughness Rz of 6.0 μm as a metal layer.

The peel strength of the metal layer was 0.91 N/mm and the soldering heat resistance was rated as A.

Example 4

In the same type of five-necked round bottom glass flask as used in Example 1, 14.573 g (0.06501 mol) of HPMDA, 40.00 g NMP and 0.33 g of TEA were stirred at 100 rpm under a nitrogen atmosphere to obtain a solution.

The solution was added with 4.427 g (0.03250 mol) of MXDA and stirred for a while to resolve MXDA. After adding 13.343 g (0.03250 mol) of BAPP and 8.51 g of NMP respectively at one time, the solution was heated on a mantle heater to raise the temperature of the reaction system to 195° C. over about 20 min. The temperature of the reaction system was maintained at 195° C. for 6 h while collecting the distillates.

The reaction solution was mixed with 71.49 g of DMAC and stirred at about 130° C. for about 30 min to obtain a uniform solution, which was then air-cooled to 100° C. over about 10 min, to obtain a Polyimide A solution having a solid content of 20% by weight.

Then, a Polyimide A film was produced in the same manner as in Example 1 except for using the Polyimide A solution prepared above. IR spectrum of Polyimide A film showed characteristic absorptions attributable to imide ring at ν (C=O) 1774 and 1697 (cm$^{-1}$). Polyimide A had a logarithmic viscosity η of 0.63 dL/g, a glass transition temperature of 232° C. and a water absorption of 2.2%. Next, a metal-clad laminate was produced in the same manner as in Example 1 except for using the Polyimide A solution prepared above. The peel strength of the metal layer was 0.95 N/mm and the soldering heat resistance was rated as A.

Example 5

A metal-clad laminate was produced in the same manner as in Example 1 except for using the Polyimide A solution obtained in Example 4, "Apical NPI" as an insulating substrate, and a 90 μm-thick rolled aluminum foil (product name "1085 Foil" available from Nippon Foil Mfg. Co., Ltd.) as a metal layer.

The peel strength of the metal layer was 1.08 N/mm and the soldering heat resistance was rated as A.

Example 6

In the same type of five-necked round bottom glass flask as used in Example 1, 19.266 g (0.04693 mol) of BAPP, 0.923 g (0.00678 mol) of MXDA, 40.00 g NMP and 0.26 g of TEA were stirred at 100 rpm under a nitrogen atmosphere to obtain a solution.

After adding 11.690 g (0.05215 mol) of HPMDA and 7.82 g of NMP respectively at one time, the solution was heated on a mantle heater to raise the temperature of the reaction system to 200° C. over about 20 min. The temperature of the reaction system was maintained at 200° C. for 5 h while collecting the distillates.

The reaction solution was mixed with 72.181 g of DMAC and stirred at about 130° C. for about 30 min to obtain a uniform solution, which was then air-cooled to 100° C. over about 10 min, to obtain a Polyimide A solution having a solid content of 20% by weight.

Then, a Polyimide A film was produced in the same manner as in Example 1 except for using the Polyimide A solution prepared above. IR spectrum of Polyimide A film showed characteristic absorptions attributable to imide ring at ν (C=O) 1772 and 1704 (cm$^{-1}$). Polyimide A had a logarithmic viscosity η of 0.52 dL/g, a glass transition temperature of 253° C. and a water absorption of 2.2%.

The Polyimide A solution prepared above was applied onto Kapton 10EN. The resultant film was dried on a hot plate at 100° C. for 0.5 h and further dried in a vacuum dryer at 200° C. for 5 h, to form a 4 μm-thick adhesive layer on Kapton 10EN.

Separately, a 4 μm-thick adhesion layer was formed on a non-roughened surface having a roughness Rz of 1.0 μm of a 9 μm-thick electrolytic copper foil (product name "F0-WS" available from Furukawa Circuit Foil Co., Ltd.) in the same manner as described above.

Then, the Kapton 100EN and the copper foil were superposed with their adhesive layers being faced to each other, and a metal-clad laminate was produced in the same manner as in Example 1.

The peel strength of the metal layer was 1.04 N/mm and the soldering heat resistance was rated as A.

Example 7

In the same type of five-necked round bottom glass flask as used in Example 1, 27.430 g (0.06682 mol) of BAPP, 50.89 g of GBL and 0.34 g of TEA were stirred at 100 rpm under a nitrogen atmosphere to obtain a solution.

After adding 14.979 g (0.06682 mol) of HPMDA and 12.72 g of DMAC respectively at one time, the solution was heated on a mantle heater to raise the temperature of the reaction system to 180° C. over about 20 min. The temperature of the reaction system was maintained at 180° C. for 6 h while collecting the distillates.

The reaction solution was mixed with 96.39 g of DMAC and stirred at about 130° C. for about 30 min to obtain a uniform solution, which was then air-cooled to 100° C. over about 10 min, to obtain a polyimide solution having a solid content of 20% by weight.

Then, a polyimide film was produced in the same manner as in Example 1 except for using the polyimide solution prepared above. IR spectrum of polyimide film showed characteristic absorptions attributable to imide ring at ν (C=O) 1774 and 1706 (cm$^{-1}$). The polyimide resin had a logarithmic viscosity η of 1.00 dL/g, a glass transition temperature of 263° C. and a water absorption of 1.6%.

Next, a metal-clad laminate was produced in the same manner as in Example 1 except for using the polyimide solution prepared above. The peel strength of the metal layer was 0.62 N/mm and the soldering heat resistance was rated as A.

Comparative Example 1

In the same type of five-necked round bottom glass flask as used in Example 1, 20.624 g (0.10299 mol) of 4,4'-diaminodiphenyl ether (ODA available from Wakayama Seika Kogyo Co., Ltd.), 52.45 g of GBL and 0.52 g of TEA were stirred at 100 rpm under a nitrogen atmosphere to obtain a solution. After adding 23.088 g (0.10299 mol) of HPMDA and 13.11 g of DMAC respectively at one time, the solution was heated on a mantle heater to raise the temperature of the reaction system to 180° C. over about 20 min. The temperature of the reaction system was maintained at 180° C. for 5 h while collecting the distillates.

The reaction solution was mixed with 94.43 g of DMAC and stirred at about 130° C. for about 30 min to obtain a uniform solution, which was then air-cooled to 100° C. over about 10 min, to obtain a polyimide solution having a solid content of 20% by weight.

Then, a polyimide film was produced in the same manner as in Example 1 except for using the polyimide solution prepared above. IR spectrum of polyimide film showed characteristic absorptions attributable to imide ring at ν (C=O) 1772 and 1700 (cm$^{-1}$). The polyimide resin had a logarithmic viscosity η of 1.06 dL/g, a glass transition temperature of 316° C. and a water absorption of 5.5%.

Next, a metal-clad laminate was produced in the same manner as in Example 1 except for using the polyimide solution prepared above. The peel strength of the metal layer was extremely low and easily peeled off.

Comparative Example 2

In the same type of five-necked round bottom glass flask as used in Example 1, 19.404 g (0.05633 mol) of α,α'-bis(3-aminophenyl)-1,4-diisopropylbenzene ("Bisaniline M" available from Mitsui Chemicals, Inc.), 38.44 g of GBL and 0.28 g of TEA were stirred at 100 rpm under a nitrogen atmosphere to obtain a solution.

After adding 12.627 g (0.05633 mol) of HPMDA and 9.61 g of DMAC respectively at one time, the solution was heated on a mantle heater to raise the temperature of the reaction system to 180° C. over about 20 min. The temperature of the reaction system was maintained at 180° C. for 12 h while collecting the distillates.

The reaction solution was mixed with 71.96 g of DMAC and stirred at about 130° C. for about 30 min to obtain a uniform solution, which was then air-cooled to 100° C. over about 10 min, to obtain a polyimide solution having a solid content of 20% by weight.

Then, a polyimide film was produced in the same manner as in Example 1 except for using the polyimide solution prepared above. IR spectrum of polyimide film showed characteristic absorptions attributable to imide ring at ν (C=O) 1774 and 1704 (cm$^{-1}$). The polyimide resin had a logarithmic viscosity η of 0.52 dL/g, a glass transition temperature of 220° C. and a water absorption of 1.5%.

Next, a metal-clad laminate was produced in the same manner as in Example 1 except for using the polyimide solution prepared above. The peel strength of the metal layer was 0.45 N/mm and the soldering heat resistance was rated as A.

TABLE 1

| | Diamine component | | |
|---|---|---|---|
| | BAPP | Comonomer | |
| | mol %* | Kind | mol %* |
| Examples | | | |
| 1 | 90 | MPD | 10 |
| 2 | 99 | MXDA | 1 |
| 3 | 99 | MXDA | 1 |
| 4 | 50 | MXDA | 50 |
| 5 | 50 | MXDA | 50 |
| 6 | 90 | MXDA | 13 |
| 7 | 100 | — | — |
| Comparative Examples | | | |
| 1 | 0 | ODA | 100 |
| 2 | 0 | Bisaniline M | 100 |

TABLE 1-continued

| | Logarithmic viscosity η (dL/g) | Glass transition temperature (° C.) | Water absorption (%) | Peel strength (N/mm) | Soldering heat resistance |
|---|---|---|---|---|---|
| Examples | | | | | |
| 1 | 1.05 | 268 | 2.1 | 1.09 | A |
| 2 | 1.01 | 262 | 1.9 | 0.87 | A |
| 3 | 1.01 | 262 | 1.9 | 0.87 | A |
| 4 | 0.63 | 232 | 2.2 | 0.95 | A |
| 5 | 0.63 | 232 | 2.2 | 1.08 | A |
| 6 | 0.52 | 253 | 2.2 | 1.04 | A |
| 7 | 1.00 | 263 | 1.6 | 0.62 | A |
| Comparative Examples | | | | | |
| 1 | 1.06 | 316 | 5.5 | <0.2 | — |
| 2 | 0.52 | 220 | 1.5 | 0.45 | A |

*On the basis of the amount of HPMDA.

Example 8

In the same type of five-necked round bottom glass flask as used in Example 1, 27.244 g (0.06637 mol) of BAPP, 0.145 g (0.00067 mol) of 3,3'-dihydroxy-4,4'-diaminobiphenyl (HAB available from Wakayama Seika Kogyo Co., Ltd.), 50.90 g of GBL and 0.339 g of TEA were stirred at 100 rpm under a nitrogen atmosphere to obtain a solution.

After adding 15.027 g (0.06704 mol) of HPMDA and 12.72 g of DMAC respectively at one time, the solution was heated on a mantle heater to raise the temperature of the reaction system to 180° C. over about 20 min. The temperature of the reaction system was maintained at 180° C. for 5 h while collecting the distillates.

The reaction solution was mixed with 96.38 g of DMAC and stirred at about 130° C. for about 30 min to obtain a uniform solution, which was then air-cooled to 100° C. over about 10 min, to obtain a Polyimide A solution having a solid content of 20% by weight.

Then, a Polyimide A film was produced in the same manner as in Example 1 except for using the Polyimide A solution prepared above. IR spectrum of Polyimide A film showed characteristic absorptions attributable to imide ring at ν (C=O) 1776 and 1706 (cm$^{-1}$). Polyimide A had a concentration F of functional group of 0.034 meq/g, a logarithmic viscosity η of 1.10 dL/g, a glass transition temperature of 264° C. and a water absorption of 1.9%.

Next, a metal-clad laminate was produced in the same manner as in Example 1 except for using the Polyimide A solution prepared above. The peel strength of the metal layer was 1.05 N/mm and the soldering heat resistance was rated as A.

Example 9

A metal-clad laminate was produced in the same manner as in Example 1 except for using the Polyimide A solution obtained in Example 8, a 25 μm-thick Apical NPI as an insulating substrate, and a 18 μm-thick electrolytic copper foil (product name "JTC" available from Nikko Materials Co., Ltd.) having a roughened surface with a roughness Rz of 6.0 μm as a metal layer.

17

The peel strength of the metal layer was 1.10 N/mm and the soldering heat resistance was rated as A.

Example 10

In the same type of five-necked round bottom glass flask as used in Example 1, 26.956 g (0.06566 mol) of BAPP, 0.309 g (0.00203 mol) of 3,5-diaminobenzoic acid (DBA available from Acros Co., Ltd.), 50.93 g of GBL and 0.34 g of TEA were stirred at 100 rpm under a nitrogen atmosphere to obtain a solution.

After adding 15.175 g (0.06769 mol) of HPMDA and 12.73 g of DMAC respectively at one time, the solution was heated on a mantle heater to raise the temperature of the reaction system to 180° C. over about 20 min. The temperature of the reaction system was maintained at 180° C. for 4 h while collecting the distillates.

The reaction solution was mixed with 96.34 g of DMAC and stirred at about 130° C. for about 30 min to obtain a uniform solution, which was then air-cooled to 100° C. over about 10 min, to obtain a Polyimide A solution having a solid content of 20% by weight.

Then, a Polyimide A film was produced in the same manner as in Example 1 except for using the Polyimide A solution prepared above. IR spectrum of Polyimide A film showed characteristic absorptions attributable to imide ring at ν (C=O) 1776 and 1706 (cm$^{-1}$). Polyimide A had a concentration F of functional group of 0.051 meq/g, a logarithmic viscosity η of 0.78 dL/g, a glass transition temperature of 261° C. and a water absorption of 2.0%.

Next, a metal-clad laminate was produced in the same manner as in Example 1 except for using the Polyimide A solution prepared above. The peel strength of the metal layer was 0.89 N/mm and the soldering heat resistance was rated as A.

Example 11

A metal-clad laminate was produced in the same manner as in Example 1 except for using the Polyimide A solution obtained in Example 10, a 25 μm-thick Apical NPI as an insulating substrate, and a 90 μm-thick rolled aluminum foil (product name "1085 Foil" available from Nippon Foil Mfg. Co., Ltd.) as a metal layer. Before use, the adherent surface of the rolled aluminum foil was wiped with a cloth impregnated with acetone. The peel strength of the metal layer was 0.97 N/mm and the soldering heat resistance was rated as A.

Example 12

In the same type of five-necked round bottom glass flask as used in Example 1, 26.773 g (0.06522 mol) of BAPP, 0.577 g (0.00202 mol) of 3,3'-dicarboxy-4,4'-diaminodiphenylmethane (MBAA available from Wakayama Seika Kogyo Co., Ltd.), 50.91 g of GBL and 0.34 g of TEA were stirred at 100 rpm under a nitrogen atmosphere to obtain a solution.

After adding 15.072 g (0.06724 mol) of HPMDA and 12.73 g of DMAC respectively at one time, the solution was heated on a mantle heater to raise the temperature of the reaction system to 180° C. over about 20 min. The temperature of the reaction system was maintained at 180° C. for 6 h while collecting the distillates.

The reaction solution was mixed with 96.37 g of DMAC and stirred at about 130° C. for about 30 min to obtain a uniform solution, which was then air-cooled to 100° C. over about 10 min, to obtain a Polyimide A solution having a solid content of 20% by weight.

18

Then, a Polyimide A film was produced in the same manner as in Example 1 except for using the Polyimide A solution prepared above. IR spectrum of Polyimide A film showed characteristic absorptions attributable to imide ring at ν (C=O) 1776 and 1706 (cm$^{-1}$).

Polyimide A had a concentration F of functional group of 0.101 meq/g, a logarithmic viscosity η of 1.05 dL/g, a glass transition temperature of 263° C. and a water absorption of 1.9%. Next, a metal-clad laminate was produced in the same manner as in Example 1 except for using the Polyimide A solution prepared above. The peel strength of the metal layer was 0.81 N/mm and the soldering heat resistance was rated as A.

Example 13

In the same type of five-necked round bottom glass flask as used in Example 1, 26.874 g (0.06546 mol) of BAPP, 0.430 g (0.00202 mol) of 4,4'-diaminobenzophenone (4,4'-DBP available from Aldrich Chemical Co., Inc.), 50.92 g of GBL and 0.34 g of TEA were stirred at 100 rpm under a nitrogen atmosphere to obtain a solution.

After adding 15.129 g (0.06749 mol) of HPMDA and 12.73 g of DMAC respectively at one time, the solution was heated on a mantle heater to raise the temperature of the reaction system to 180° C. over about 20 min. The temperature of the reaction system was maintained at 180° C. for 6 h while collecting the distillates.

The reaction solution was mixed with 96.35 g of DMAC and stirred at about 130° C. for about 30 min to obtain a uniform solution, which was then air-cooled to 100° C. over about 10 min, to obtain a Polyimide A solution having a solid content of 20% by weight.

Then, a Polyimide A film was produced in the same manner as in Example 1 except for using the Polyimide A solution prepared above. IR spectrum of polyimide film showed characteristic absorptions attributable to imide ring at ν (C=O) 1776 and 1704 (cm$^{-1}$).

Polyimide A had a concentration F of functional group of 0.051 meq/g, a logarithmic viscosity η of 0.74 dL/g, a glass transition temperature of 262° C. and a water absorption of 1.7%.

Next, a metal-clad laminate was produced in the same manner as in Example 1 except for using the Polyimide A solution prepared above. The peel strength of the metal layer was 0.86 N/mm and the soldering heat resistance was rated as A.

Comparative Example 3

In the same type of five-necked round bottom glass flask as used in Example 1, 15.436 g (0.03760 mol) of BAPP, 4.005 g (0.01852 mol) of HAB, 38.43 g of GBL and 0.28 g of TEA were stirred at 100 rpm under a nitrogen atmosphere to obtain a solution.

After adding 12.581 g (0.05612 mol) of HPMDA and 9.61 g of DMAC respectively at one time, the solution was heated on a mantle heater to raise the temperature of the reaction system to 180° C. over about 20 min. The temperature of the reaction system was maintained at 180° C. for 6 h while collecting the distillates.

The reaction solution was mixed with 71.97 g of DMAC and stirred at about 130° C. for about 30 min to obtain a uniform solution, which was then air-cooled to 100° C. over about 10 min, to obtain a polyimide solution having a solid content of 20% by weight.

Then, a polyimide film was produced in the same manner as in Example 1 except for using the polyimide solution prepared above. IR spectrum of polyimide film showed characteristic absorptions attributable to imide ring at ν (C=O) 1772 and 1704 (cm$^{-1}$). The polyimide resin had a concentration F of functional group of 1.235 meq/g, a logarithmic viscosity η of 0.89 dL/g, a glass transition temperature of 300° C. and a water absorption of 5.0%.

Next, a metal-clad laminate was produced in the same manner as in Example 1 except for using the polyimide solution prepared above. The peel strength of the metal layer was 1.00 N/mm and the soldering heat resistance was rated as C.

TABLE 2

| | Diamine component | | | | | |
|---|---|---|---|---|---|---|
| | BAPP | Comonomer | | | | |
| | mol % | Kind | mol % | | | |
| Examples | | | | | | |
| 8 | 99 | HAB | 1 | | | |
| 9 | 99 | HAB | 1 | | | |
| 10 | 97 | DBA | 3 | | | |
| 11 | 97 | DBA | 3 | | | |
| 12 | 97 | MBAA | 3 | | | |
| 13 | 97 | 4,4'-DBP | 3 | | | |
| Comparative Example | | | | | | |
| 3 | 67 | HAB | 33 | | | |

| | Concentration of functional group (meq/g) | Logarithmic viscosity η (dL/g) | Glass transition temperature (° C.) | Water absorption (%) | Peel strength (N/mm) | Soldering heat resistance |
|---|---|---|---|---|---|---|
| Examples | | | | | | |
| 8 | 0.034 | 1.10 | 264 | 1.9 | 1.05 | A |
| 9 | 0.034 | 1.10 | 264 | 1.9 | 1.10 | A |
| 10 | 0.051 | 0.78 | 261 | 2.0 | 0.89 | A |
| 11 | 0.051 | 0.78 | 261 | 2.0 | 0.97 | A |
| 12 | 0.101 | 1.05 | 263 | 1.9 | 0.81 | A |
| 13 | 0.051 | 0.74 | 262 | 1.7 | 0.86 | A |
| Comparative Example | | | | | | |
| 3 | 1.235 | 0.89 | 300 | 5.0 | 1.00 | C |

Example 14

In the same type of five-necked round bottom glass flask as used in Example 1, 27.533 g (0.06707 mol) of BAPP, 50.901 g of GBL and 0.336 g of TEA were stirred at 100 rpm under a nitrogen atmosphere to obtain a solution.

After adding 14.885 g (0.06640 mol) of HPMDA and 12.725 g of DMAC respectively at one time, the solution was heated on a mantle heater to raise the temperature of the reaction system to 180° C. over about 20 min. The temperature of the reaction system was maintained at 180° C. for 3 h while collecting the distillates.

The reaction solution was mixed with 96.374 g of DMAC and stirred at about 130° C. for about 30 min to obtain a uniform solution, which was then air-cooled to 100° C. over about 10 min, to obtain a Polyimide A solution having a solid content of 20% by weight.

Then, a Polyimide A film was produced in the same manner as in Example 1 except for using the Polyimide A solution prepared above. IR spectrum of Polyimide A film showed characteristic absorptions attributable to imide ring at ν (C=O) 1774 and 1706 (cm$^{-1}$). Polyimide A had a logarithmic viscosity η of 0.71 dL/g, a glass transition temperature of 262° C. and a water absorption of 1.7%.

Next, a metal-clad laminate was produced in the same manner as in Example 1 except for using the Polyimide A solution prepared above. The peel strength of the metal layer was 0.86 N/mm and the soldering heat resistance was rated as A.

Example 15

In the same type of five-necked round bottom glass flask as used in Example 1, 14.214 g (0.03463 mol) of BAPP, 12.757 g (0.03463 mol) of 4,4'-bis(4-aminophenoxy)biphenyl (BAPB available from Wakayama Seika Kogyo Co., Ltd.), 50.995 g of GBL and 0.350 g of TEA were stirred at 100 rpm under a nitrogen atmosphere to obtain a solution.

After adding 15.524 g (0.06925 mol) of HPMDA and 12.749 g of DMAC respectively at one time, the solution was heated on a mantle heater to raise the temperature of the reaction system to 180° C. over about 20 min. The temperature of the reaction system was maintained at 180° C. for 4 h while collecting the distillates.

The reaction solution was mixed with 96.256 g of DMAC and stirred at about 130° C. for about 30 min to obtain a uniform solution, which was then air-cooled to 100° C. over about 10 min, to obtain a Polyimide A solution having a solid content of 20% by weight.

Then, a Polyimide A film was produced in the same manner as in Example 1 except for using the Polyimide A solution prepared above. IR spectrum of Polyimide A film showed characteristic absorptions attributable to imide ring at ν (C=O) 1779 and 1704 (cm$^{-1}$). Polyimide A had a logarithmic viscosity η of 0.95 dL/g, a glass transition temperature of 278° C. and a water absorption of 1.9%.

Next, a metal-clad laminate was produced in the same manner as in Example 1 except for using the Polyimide A solution prepared above. The peel strength of the metal layer was 0.81 N/mm and the soldering heat resistance was rated as A.

Example 16

A metal-clad laminate was produced in the same manner as in Example 1 except for using the Polyimide A solution obtained in Example 15, a 25 μm-thick Apical NPI as an insulating substrate, and a 18 μm-thick electrolytic copper foil (product name "JTC" available from Nikko Materials Co., Ltd.) having a roughened surface with a roughness Rz of 6.0 μm as a metal layer.

The peel strength of the metal layer was 0.85 N/mm and the soldering heat resistance was rated as A.

Example 17

In the same type of five-necked round bottom glass flask as used in Example 1, 24.158 g (0.05885 mol) of BAPP, 2.004 g (0.01471 mol) of p-xylylenediamine (PXDA available from Mitsubishi Gas Chemical Company, Inc.), 50.000 g of NMP and 0.372 g of TEA were stirred at 100 rpm under a nitrogen atmosphere to obtain a solution.

After adding 16.490 g (0.07356 mol) of HPMDA and 13.997 g of NMP respectively at one time, the solution was heated on a mantle heater to raise the temperature of the reaction system to 195° C. over about 20 min. The temperature of the reaction system was maintained at 195° C. for 3 h while collecting the distillates.

The reaction solution was mixed with 96.023 g of DMAC and stirred at about 130° C. for about 30 min to obtain a uniform solution, which was then air-cooled to 100° C. over about 10 min, to obtain a Polyimide A solution having a solid content of 20% by weight.

Then, a Polyimide A film was produced in the same manner as in Example 1 except for using the Polyimide A solution prepared above. IR spectrum of Polyimide A film showed characteristic absorptions attributable to imide ring at ν (C=O) 1772 and 1699 (cm$^{-1}$). Polyimide A had a logarithmic viscosity η of 0.71 dL/g, a glass transition temperature of 261° C. and a water absorption of 2.2%.

Next, a metal-clad laminate was produced in the same manner as in Example 1 except for using the Polyimide A solution prepared above. The peel strength of the metal layer was 0.85 N/mm and the soldering heat resistance was rated as A.

Example 18

A metal-clad laminate was produced in the same manner as in Example 1 except for using the Polyimide A solution obtained in Example 17, a 25 μm-thick Apical NPI as an insulating substrate, and a 90 μm-thick rolled aluminum foil (product name "1085 Foil" available from Nippon Foil Mfg. Co., Ltd.) as a metal layer. Before use, the adherent surface of the rolled aluminum foil was wiped with a cloth impregnated with acetone.

The peel strength of the metal layer was 0.95 N/mm and the soldering heat resistance was rated as A.

Comparative Example 4

In the same type of five-necked round bottom glass flask as used in Example 1, 20.624 g (0.10299 mol) of 4,4"-diaminodiphenyl ether (ODA available from Wakayama Seika Kogyo Co., Ltd.), 52.45 g of GBL and 0.52 g of TEA were stirred at 100 rpm under a nitrogen atmosphere to obtain a solution.

After adding 23.088 g (0.10299 mol) of HPMDA and 13.11 g of DMAC respectively at one time, the solution was heated on a mantle heater to raise the temperature of the reaction system to 180° C. over about 20 min. The temperature of the reaction system was maintained at 180° C. for 3 h while collecting the distillates.

The reaction solution was mixed with 94.43 g of DMAC and stirred at about 130° C. for about 30 min to obtain a uniform solution, which was then air-cooled to 100° C. over about 10 min, to obtain a polyimide solution having a solid content of 20% by weight.

Then, a polyimide film was produced in the same manner as in Example 1 except for using the polyimide solution prepared above. IR spectrum of polyimide film showed characteristic absorptions attributable to imide ring at ν (C=O) 1772 and 1700 (cm$^{-1}$). The polyimide resin had a concentration F of functional group of 1.235 meq/g, a logarithmic viscosity η of 0.90 dL/g, a glass transition temperature of 315° C. and a water absorption of 5.7%.

Next, a metal-clad laminate was produced in the same manner as in Example 1 except for using the polyimide solution prepared above. The peel strength of the metal layer was extremely low and easily peeled off.

TABLE 3

| | Diamine component | | | |
|---|---|---|---|---|
| | HPMDA | BAPP | Comonomer | |
| | mol % | mol % | Kind | mol % |
| Examples | | | | |
| 14 | 99 | 100 | — | — |
| 15 | 100 | 50 | BAPB | 50 |
| 16 | 100 | 50 | BAPB | 50 |
| 17 | 100 | 80 | PXDA | 20 |
| 18 | 100 | 80 | PXDA | 20 |
| Comparative Example | | | | |
| 4 | 100 | — | ODA | 100 |

| | Logarithmic viscosity η (dL/g) | Glass transition temperature (° C.) | Water absorption (%) | Peel strength (N/mm) | Soldering heat resistance |
|---|---|---|---|---|---|
| Examples | | | | | |
| 14 | 0.71 | 262 | 1.7 | 0.86 | A |
| 15 | 0.95 | 278 | 1.9 | 0.81 | A |
| 16 | 0.95 | 278 | 1.9 | 0.85 | A |
| 17 | 0.71 | 261 | 2.2 | 0.85 | A |
| 18 | 0.71 | 261 | 2.2 | 0.95 | A |
| Comparative Example | | | | | |
| 4 | 0.90 | 315 | 5.7 | <0.2 | — |

INDUSTRIAL APPLICABILITY

The polyimide resin of the present invention exhibits a good thermoplastic property, a high solubility in solvent and a good heat resistance as well as a low-water absorption and further an excellent adhesion property. Therefore, the polyimide resin is useful as the material of an adhesive layer of a metal-clad laminate which is applicable to printed wiring boards, surface heating elements, electromagnetic shielding materials flat cables, etc.

The invention claimed is:

1. A polyimide resin comprising a repeating unit represented by the following formula (1):

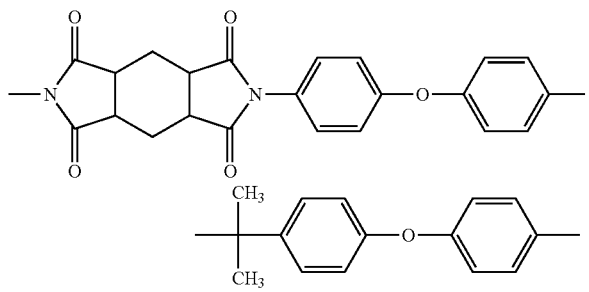

or comprising the repeating unit of the formula (1) and at least one repeating unit represented by the following formula (2):

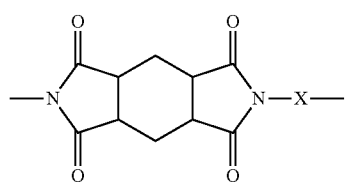

wherein X is a divalent aliphatic group having 2 to 39 carbon atoms, a divalent alicyclic group having 3 to 39 carbon atoms, a divalent aromatic group having 6 to 39 carbon atoms or a combination of the preceding divalent groups; a main chain of X optionally has at least one intervening bonding group selected from the group consisting of —O—, —SO$_2$—, —CH$_2$—, —C(CH$_3$)$_2$—, —OSi(CH$_3$)$_2$—, —C$_2$H$_4$O— and —S—; and X optionally has at least one functional group selected from the group consisting of carboxyl group, hydroxyl group and carbonyl group in a concentration F of more than zero but not more than 1 meq/g polyimide resin,
  a content of the repeating unit of the formula (1) being 50 mol % or more of a total of the repeating units, and a logarithmic viscosity η of the polyimide resin being from 0.3 to 2 dL/g when measured at 30° C. using a 0.5 g/dL solution of the polyimide resin in N-methyl-2-pyrrolidone.

2. The polyimide resin according to claim 1, wherein X in the formula (2) is m-phenylene group or m-xylylene group.

3. The polyimide resin according to claim 1, wherein the logarithmic viscosity η is from 0.3 to 1 dL/g.

4. The polyimide resin according to claim 1, wherein the polyimide resin has a water absorption of 2.5% or less.

5. A polyimide resin solution comprising the polyimide resin as defined in claim 1 and an organic solvent.

6. The polyimide resin according to claim 1, wherein the content of the repeating unit of the formula (1) is 70 mol % or more of a total of the repeating units.

7. The polyimide resin according to claim 1, wherein the content of the repeating unit of the formula (1) is 80 mol % or more of a total of the repeating units.

8. A process for producing a polyimide resin which comprises a repeating unit represented by the following formula (1)):

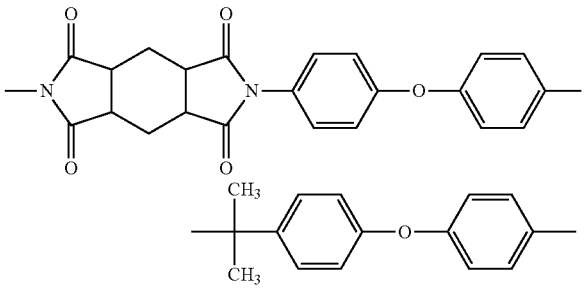

or comprises the repeating unit of the formula (1) and at least one repeating unit represented by the following formula (2):

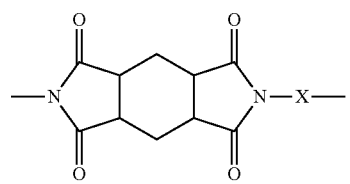

wherein X is a divalent aliphatic group having 2 to 39 carbon atoms, a divalent alicyclic group having 3 to 39 carbon atoms, a divalent aromatic group having 6 to 39 carbon atoms or a combination of these divalent groups; a main chain of X optionally has at least one intervening bonding group selected from the group consisting of —O—, —SO$_2$—, —CH$_2$—, —C(CH$_3$)$_2$—, —OSi(CH$_3$)$_2$—, —C$_2$H$_4$O— and —S—; and X optionally has at least one functional group selected from the group consisting of carboxyl group, hydroxyl group and carbonyl group in a concentration F of more than zero but not more than 1 meq/g polyimide resin,
  a content of the repeating unit of the formula (1) being 50 mol % or more of a total of the repeating units,
  said process comprising a step of reacting at least one tetracarboxylic acid component (Y) selected from the group consisting of 1,2,4,5-cyclohexanetetracarboxylic acid, 1,2,4,5-cyclohexanetetracarboxylic dianhydride and reactive derivatives of 1,2,4,5-cyclohexanetetracarboxylic acid with a diamine component (Z) comprising a diamine component (Z1) or a mixture of the diamine component (Z1) and a diamine component (Z2),
  wherein (a) the diamine component (Z1) is at least one compound selected from the group consisting of 2,2-bis[4-(4-aminophenoxy)phenyl]propane and reactive derivatives thereof,
  (b) the diamine component (Z2) is different from the diamine component (Z1) and at least one compound selected from the group consisting of diamines represented by the formula: NH$_2$—X—NH$_2$ wherein X is the same as defined above and reactive derivatives thereof; and
  (c) when the diamine component (Z) is in the form of mixture, the diamine component (Z1) is used in an amount of 50 mol % or more on the basis of a total amount of the diamine component (Z1) and the diamine component (Z2).

9. The process according to claim 8, wherein the diamine component (Z1) is at least one compound selected from the group consisting of 2,2-bis[4-(4-aminophenoxy)phenyl]propane and reactive derivatives thereof, and the diamine component (Z2) is at least one compound selected from the group consisting of m-phenylenediamine, m-xylylenediamine and reactive derivatives thereof.

10. The process according to claim 8, wherein a logarithmic viscosity η of the polyimide resin is from 0.3 to 1 dL/g.

11. The process according to claim 8, wherein the reaction is conducted in an organic solvent in the presence or absence of a catalyst under heating, to obtain a polyimide resin solution.

12. The process according to claim 11, wherein the catalyst is a tertiary amine.

13. The process according to claim 11, wherein the heating is conducted at 180 to 205° C. for 2 to 12 h.

14. A process for producing a polyimide resin film, comprising a step of casting the polyimide resin solution as defined in claim 5 on a substrate and a step of removing the organic solvent by evaporation.

15. The process according to claim 14, wherein the organic solvent is removed by evaporation at 120° C. or lower to obtain a self-supporting film, and the self-supporting film is separated from the substrate, fixed at ends thereof, and then dried at a temperature ranging from the boiling point of the organic solvent to 350° C.

16. A metal-clad laminate comprising an insulating substrate, a metal layer and an adhesive layer, the adhesive layer being formed from the polyimide resin as defined in claim 1, and the adhesive layer being disposed between the insulating substrate and the metal layer.

17. A metal-clad laminate comprising an insulating substrate, a metal layer and an adhesive layer, the adhesive layer being disposed between the insulating substrate and the metal layer, wherein the adhesive layer is formed by applying the polyimide resin solution as defined in claim 5 onto one or both of the insulating substrate and the metal layer and then removing the organic solvent by evaporation.

18. A metal-clad laminate comprising an insulating substrate, a metal layer and an adhesive layer, the adhesive layer being disposed between the insulating substrate and the metal layer, wherein the adhesive layer is formed from the polyimide resin film obtained in the process as defined in claim 14.

19. The metal-clad laminate according to claim 16, wherein the polyimide resin has a glass transition temperature of 300° C. or lower.

20. The metal-clad laminate according to claim 16, wherein a surface of the metal layer which faces the adhesive layer has a surface roughness Rz of 0.1 to 2 μm.

21. The metal-clad laminate according to claim 16, wherein the metal layer has a peel strength of 0.5 N/mm or more when measured by a method of measuring a 90° peel strength of a copper foil according to JIS C6471.

22. A process for producing a polyimide resin film, comprising a step of casting the polyimide resin solution obtained in the process as defined in claim 11 on a substrate and a step of removing the organic solvent by evaporation.

23. The process according to claim 22, wherein the organic solvent is removed by evaporation at 120° C. or lower to obtain a self-supporting film, and the self-supporting film is separated from the substrate, fixed at ends thereof, and then dried at a temperature ranging from the boiling point of the organic solvent to 350° C.

24. A metal-clad laminate comprising an insulating substrate, a metal layer and an adhesive layer, the adhesive layer being disposed between the insulating substrate and the metal layer, wherein the adhesive layer is formed from the polyimide resin film obtained in the process as defined in claim 22.

25. A metal-clad laminate comprising an insulating substrate, a metal layer and an adhesive layer, the adhesive layer being formed from the polyimide resin obtained in the process as defined in claim 8, and the adhesive layer being disposed between the insulating substrate and the metal layer.

26. A metal-clad laminate comprising an insulating substrate, a metal layer and an adhesive layer, the adhesive layer being disposed between the insulating substrate and the metal layer, wherein the adhesive layer is formed by applying the polyimide resin solution obtained in the process as defined in claim 11 onto one or both of the insulating substrate and the metal layer and then removing the organic solvent by evaporation.

27. The metal-clad laminate according to claim 25, wherein the polyimide resin has a glass transition temperature of 300° C. or lower.

28. The metal-clad laminate according to claim 26, wherein the polyimide resin has a glass transition temperature of 300° C. or lower.

29. The metal-clad laminate according to claim 25, wherein a surface of the metal layer which faces the adhesive layer has a surface roughness Rz of 0.1 to 2 μm.

30. The metal-clad laminate according to claim 26, wherein a surface of the metal layer which faces the adhesive layer has a surface roughness Rz of 0.1 to 2 μm.

31. The metal-clad laminate according to claim 25, wherein the metal layer has a peel strength of 0.5 N/mm or more when measured by a method of measuring a 90° peel strength of a copper foil according to JIS C6471.

32. The metal-clad laminate according to claim 26, wherein the metal layer has a peel strength of 0.5 N/mm or more when measured by a method of measuring a 90° peel strength of a copper foil according to JIS C6471.

* * * * *